United States Patent
Bohannon et al.

(10) Patent No.: US 10,831,323 B2
(45) Date of Patent: Nov. 10, 2020

(54) OHMMETER FOR SENSOR ELECTRODES

(71) Applicant: Synaptics Incorporated, San Jose, CA (US)

(72) Inventors: Eric Scott Bohannon, Henrietta, NY (US); Steve Chikin Lo, Sunnyvale, CA (US); Petr Shepelev, Campbell, CA (US)

(73) Assignee: Synaptics Incorporated, San Jose, CA (US)

( * ) Notice: Subject to any disclaimer, the term of this patent is extended or adjusted under 35 U.S.C. 154(b) by 106 days.

(21) Appl. No.: 16/036,018

(22) Filed: Jul. 16, 2018

(65) Prior Publication Data

US 2019/0095002 A1  Mar. 28, 2019

Related U.S. Application Data

(60) Provisional application No. 62/561,945, filed on Sep. 22, 2017.

(51) Int. Cl.
  *G06F 3/044* (2006.01)
  *H03K 17/96* (2006.01)
  *G06F 3/041* (2006.01)

(52) U.S. Cl.
  CPC ............ *G06F 3/044* (2013.01); *G06F 3/0416* (2013.01); *G06F 3/0418* (2013.01); *H03K 17/962* (2013.01); *H03K 17/9645* (2013.01); *G06F 3/0412* (2013.01); *G06F 3/0414* (2013.01); *G06F 2203/04105* (2013.01); *G06F 2203/04106* (2013.01); *G06F 2203/04112* (2013.01)

(58) Field of Classification Search
  CPC ........ G06F 3/041; G06F 3/044; G06F 3/0412; G06F 3/0416; G06F 3/0418; H01L 27/323
  USPC .................................................. 345/173, 174
  See application file for complete search history.

(56) References Cited

U.S. PATENT DOCUMENTS

| 8,780,074 | B2 * | 7/2014 | Castillo ................... | G06F 3/044 345/174 |
| 8,970,124 | B2 * | 3/2015 | Kameyama ............ | H05B 45/37 315/291 |
| 9,013,465 | B2 * | 4/2015 | Chung ................. | G09G 3/3233 345/212 |
| 2017/0315653 | A1 * | 11/2017 | Vandermeijden ..... | G06F 3/0416 |
| 2018/0032176 | A1 * | 2/2018 | Krah ........................ | G06F 3/044 |

* cited by examiner

*Primary Examiner* — Calvin C Ma
(74) *Attorney, Agent, or Firm* — Paradice & Li LLP

(57) ABSTRACT

An input device includes a plurality of sensor electrodes and a processing system that is operable in at least a first mode or a second mode. The processing system is configured to receive an input current from a pair of the sensor electrodes. When operating the first mode, the processing system is configured to measure a capacitance across the pair of sensor electrodes based on the received input current. When operating the second mode, the processing system is configured to measure a resistance between the pair of sensor electrodes based on the received input current.

19 Claims, 5 Drawing Sheets

OHMMETER FOR SENSOR ELECTRODES

CROSS-REFERENCE TO RELATED APPLICATION

This application claims priority and benefit under 35 USC § 119(e) to U.S. Provisional Patent Application No. 62/561,945, filed on Sep. 22, 2017, which is incorporated herein by reference in its entirety.

TECHNICAL FIELD

The present embodiments relate generally to capacitive sensing, and specifically to measuring a resistance between sensor electrodes.

BACKGROUND OF RELATED ART

Input devices including proximity sensor devices are widely used in a variety of electronic systems. A proximity sensor device may include a sensing region, often demarked by an input surface, in which the proximity sensor device determines the presence, location, force, and/or motion of one or more input objects. Proximity sensor devices may be used to provide interfaces for the electronic system. For example, proximity sensor devices may be used as input devices for larger computing systems (such as opaque touchpads integrated in, or peripheral to, notebook or desktop computers). Proximity sensor devices may also be used in smaller computing systems, such as touch screens integrated in cellular phones.

Proximity sensors may operate by detecting changes in an electric field and/or capacitance in the sensing region. For example, the sensing region may include a number of conductors that can be configured to transmit and/or receive an electric signal. The signal can then be used to measure a capacitive coupling between various pairs of conductors. A "baseline" represents the expected capacitance for a pair of conductors when no external objects are present in the sensing region. Objects in contact with (or close proximity to) the sensing region may alter the effective capacitance of the conductors (e.g., from the baseline). Thus, a detected change in capacitance across one or more pairs of conductors may signal the presence and/or position of an object in the sensing region.

To detect a (change in) capacitance between a pair of conductors, the conductors in the sensing region should be electrically isolated from one another. However, manufacturing defects may cause two or more of the conductors to become shorted together. As a result, such conductors may be ineffective and/or inoperable as proximity sensors.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A method of measuring a resistance between sensor electrodes of an input device is disclosed. The method may be performed by an input device including a plurality of sensor electrodes disposed within a sensing region and a processing system coupled to at least a pair of the sensor electrodes and configured to operate in at least a first mode or a second mode. When operating in the first mode, the processing system is configured to measure a first current across the pair of sensor electrodes and determine a capacitance of the pair of sensor electrodes based on the measured first current. When operating in the second mode, the processing system is configured to measure a second current across the pair of sensor electrodes and determine a resistance of the pair of sensor electrodes based on the measured second current.

In some embodiments, when operating in the first mode, the processing system may be further configured to detect user inputs in the sensing region based at least in part on the determined capacitance. In some embodiments, when operating in the second mode, the processing system may be further configured to detect electrical shorts between the pair of sensor electrodes based at least in part on the determined resistance. In some other embodiments, when operating in the second mode, the processing system may be further configured to determine an amount of strain on the input device based at least in part on the determined resistance.

In some embodiments, the processing system may be configured to drive a time-varying voltage across the pair of sensor electrodes to produce the first current. For example, the time-varying voltage may be used to produce an alternating current (AC) across the pair of sensor electrodes. In some other embodiments, the processing system may be configured to drive a constant voltage across the pair of sensor electrodes to produce the second current. For example, the constant voltage may be used to produce a direct current (DC) across the pair of sensor electrodes.

In some embodiments, the processing system may include an amplifier, an analog-to-digital converter (ADC), and a mixer. The amplifier may be configured to receive and amplify the input current from the pair of sensor electrodes. The ADC may be configured to convert the amplified input current to a digital bit stream. For example, the digital bit stream may be a quantized representation of the input current. The mixer may be switchably coupled between the amplifier and the ADC based at least in part on the operating mode of the processing system.

In some aspects, the mixer may be configured to demodulate the amplified input current when the processing system operates in the first mode. In some other aspects, the amplified input current may be provided directly to the ADC, bypassing the mixer, when the processing system operates in the second mode.

BRIEF DESCRIPTION OF THE DRAWINGS

The present embodiments are illustrated by way of example and are not intended to be limited by the figures of the accompanying drawings.

DETAILED DESCRIPTION

Figure 1:
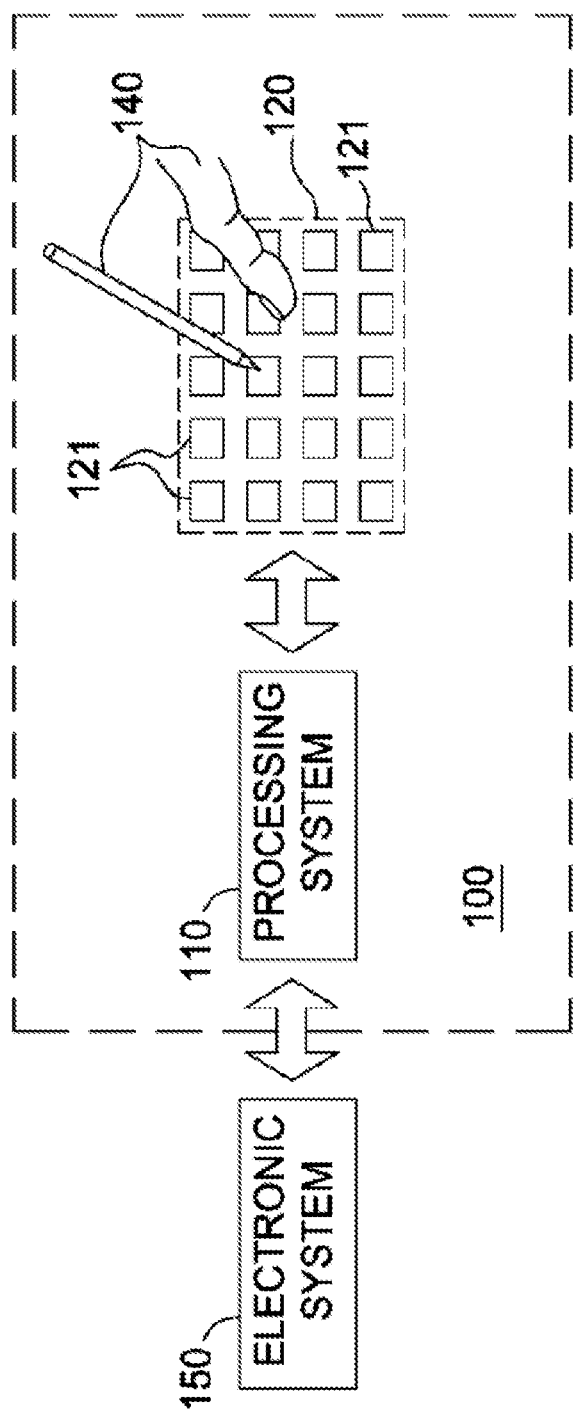
FIG. 1 shows an example input device within which the present embodiments may be implemented.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory. The interconnection between circuit elements or software blocks may be shown as buses or as single signal lines. Each of the buses may alternatively be a single signal line, and each of the single signal lines may alternatively be buses, and a single line or bus may represent any one or more of a myriad of physical or logical mechanisms for communication between components.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory computer-readable storage medium comprising instructions that, when executed, performs one or more of the methods described above. The non-transitory computer-readable storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors. The term "processor," as used herein may refer to any general purpose processor, conventional processor, controller, microcontroller, and/or state machine capable of executing scripts or instructions of one or more software programs stored in memory.

FIG. 1 shows an example input device 100 within which the present embodiments may be implemented. The input device 100 includes a processing system 110 and a sensing region 120. The input device 100 may be configured to provide input to an electronic system 150. Examples of electronic systems may include personal computing devices (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones such as smart phones), and media devices (e.g., recorders, editors, and players such as televisions, set-top boxes, music players, digital photo frames, and digital cameras).

In some aspects, the input device 100 may be implemented as a physical part of the corresponding electronic system. Alternatively, the input device 100 may be physically separated from the electronic system. The input device 100 may be coupled to (and communicate with) components of the electronic system using various wired and/or wireless interconnection and communication technologies, such as buses and networks. Examples technologies may include Inter-Integrated Circuit ($I^2C$), Serial Peripheral Interface (SPI), PS/2, Universal Serial bus (USB), Bluetooth®, Infrared Data Association (IrDA), and various radio frequency (RF) communication protocols defined by the IEEE 802.11 standard.

In the example of FIG. 1, the input device 100 may correspond to a proximity sensor device configured to sense input provided by one or more input objects 140 in the sensing region 120. Example proximity sensor devices may include touchpads, touch screens, touch sensor devices, and the like. Example input objects 140 may include fingers, styli, and the like. The sensing region 120 may encompass any space above, around, in, and/or proximate to the input device 100 in which the input device 100 is able to detect user input, such as provided by one or more input objects 140. The size, shape, and/or location of the sensing region 120, relative to the electronic system, may vary depending on actual implementations.

In some embodiments, the sensing region 120 may extend from a surface of the input device 100 in one or more directions in space, for example, until a signal-to-noise ratio (SNR) of the sensors falls below a threshold suitable for object detection. For example, the distance to which the sensing region 120 extends in a particular direction may be on the order of less than a millimeter, millimeters, centimeters, or more, and may vary with the type of sensing technology used and/or accuracy desired. In some embodiments, the sensing region 120 may detect inputs involving no physical contact with any surfaces of the input device 100, contact with an input surface (e.g., a touch surface and/or screen) of the input device 100, contact with an input surface of the input device 100 coupled with some amount of applied force or pressure, and/or any combination thereof.

In some embodiments, input surfaces may be provided by, and/or projected on, one or more surfaces of a housing of the input device 100 (e.g., as an image). For example, the sensing region 120 may have a rectangular shape when projected onto an input surface of the input device 100. In some aspects, inputs may be provided through images spanning one, two, three, or higher dimensional spaces in the sensing region 120. In some other aspects, inputs may be provided through projections along particular axes or planes in the sensing region 120. Still further, in some aspects, inputs may be provided through a combination of images and projections in the sensing region 120.

The input device 100 may utilize various sensing technologies to detect user input. Example sensing technologies may include capacitive, elastive, resistive, inductive, magnetic, acoustic, ultrasonic, and optical sensing technologies. In some embodiments, the input device 100 may utilize capacitive sensing technologies to detect user inputs. For example, the sensing region 120 may include one or more capacitive sensing elements 121 (e.g., sensor electrodes) to create an electric field. The input device 100 may detect inputs based on changes in capacitance of the sensing elements 121. For example, an object in contact with (or close proximity to) the electric field may cause changes in the voltage and/or current in the sensing elements 121. Such changes in voltage and/or current may be detected as "signals" indicative of user input. The sensing elements 121 may be arranged in arrays or other configurations to detect inputs at multiple points within the sensing region 120. In some aspects, some sensing elements 121 may be ohmically shorted together to form larger sensor electrodes. Some capacitive sensing technologies may utilize resistive sheets that provide a uniform layer of resistance.

Example capacitive sensing technologies may be based on "self-capacitance" (also referred to as "absolute capacitance") and/or "mutual capacitance" (also referred to as "transcapacitance"). Absolute capacitance sensing methods detect changes in the capacitive coupling between one or more of the sensing elements 121 and an input object. For example, an input object near one or more of the sensing elements 121 may alter the electric field near the sensing elements 121, thus changing the measured capacitive coupling between two or more sensor electrodes of the sensing elements 121. In some embodiments, the input device 100 may implement absolute capacitance sensing by modulating sensor electrodes with respect to a reference voltage and detecting the capacitive coupling between the sensor electrodes and input objects. The reference voltage may be substantially constant or may vary. In some aspects, the reference voltage may correspond to a ground potential.

Transcapacitance sensing methods detect changes in the capacitive coupling between sensor electrodes. The change in capacitive coupling may be between sensor electrodes in two different sensing elements 121 or between two different sensor electrodes in the same sensing element 121. For example, an input object near the sensor electrodes may alter the electric field between the sensor electrodes, thus changing the measured capacitive coupling of the sensor electrodes. In some embodiments, the input device 100 may implement transcapacitance sensing by detecting the capacitive coupling between one or more "transmitter" sensor electrodes and one or more "receiver" sensor electrodes. Transmitter sensor electrodes may be modulated relative to the receiver sensor electrodes. For example, the transmitter sensor electrodes may be modulated relative to a reference voltage to transmit signals, while the receiver sensor electrodes may be held at a relatively constant voltage to "receive" the transmitted signals. The signals received by the receiver sensor electrodes may be affected by environmental interference (e.g., from other electromagnetic signals and/or objects in contact with, or in close proximity to, the sensor electrodes). In some aspects, each sensor electrode may either be a dedicated transmitter or a dedicated receiver. In other aspects, each sensor electrode may be configured to transmit and receive.

In some embodiments, the input device 100 may further detect a force exerted on an input surface coinciding with the sensing region 120. For example, the input device 100 may include one or more force sensors configured to generate force information representative of the force exerted by the input object 140 when making contact with the sensing region 120. In some aspects, the force information may be in the form of electrical signals representative of an amplitude (or change in amplitude) of the force applied to the input surface. For example, the force sensors may be formed, at least in part, by conductors provided on an underside of the input surface and a structure (such as a midframe) underlying the input surface. More specifically, the input surface may be configured to move (e.g., deflect and/or compress) relative to the underlying structure when a force is applied the input object 140. The force sensors may produce electrical signals based on a change in capacitance, between the conductors, when the input surface moves relative to the underlying structure.

The processing system 110 may be configured to operate the hardware of the input device 100 to detect input in the sensing region 120. In some embodiments, the processing system 110 may control one or more sensor electrodes and/or force sensors to detect objects in the sensing region 120. For example, the processing system 110 may be configured to transmit signals via one or more transmitter sensor electrodes and receive signals via one or more receiver sensor electrodes. The processing system 110 may also be configured to receive force information via one or more force sensors. In some aspects, one or more components of the processing system 110 may be co-located, for example, in close proximity to the sensing elements of the input device 100. In other aspects, one or more components of the processing system 110 may be physically separated from the sensing elements of the input device 100. For example, the input device 100 may be a peripheral coupled to a computing device, and the processing system 110 may be implemented as software executed by a central processing unit (CPU) of the computing device. In another example, the input device 100 may be physically integrated in a mobile device, and the processing system 110 may correspond, at least in part, to a CPU of the mobile device.

In some embodiments, the processing system 110 may be implemented as a set of modules that are implemented in firmware, software, or a combination thereof. Example modules include hardware operation modules for operating hardware such as sensor electrodes and display screens; data processing modules for processing data such as sensor signals and positional information; and reporting modules for reporting information. In some embodiments, the processing system 110 may include sensor operation modules configured to operate sensing elements to detect user input in the sensing region 120; identification modules configured to identify gestures such as mode changing gestures; and mode changing modules for changing operation modes of the input device 100 and/or electronic system.

The processing system 110 may respond to user input in the sensing region 120 by triggering one or more actions. Example actions include changing an operation mode of the input device 100 and/or graphical user interface (GUI) actions such as cursor movement, selection, menu navigation, and the like. In some embodiments, the processing system 110 may provide information about the detected input to the electronic system (e.g., to a CPU of the electronic system). The electronic system may then process information received from the processing system 110 to carry out additional actions (e.g., changing a mode of the electronic system and/or GUI actions).

The processing system 110 may operate the sensing elements of the input device 100 to produce electrical signals indicative of input (or lack of input) in the sensing region 120. The processing system 110 may perform any appropriate amount of processing on the electrical signals to translate or generate the information provided to the electronic system. For example, the processing system 110 may digitize analog signals received via the sensor electrodes and/or perform filtering or conditioning on the received signals. In some aspects, the processing system 110 may subtract or otherwise account for a "baseline" associated with the sensor electrodes. For example, the baseline may represent a state of the sensor electrodes when no user input is detected. In some embodiments, the processing system 110 may further determine positional information and/or force information for a detected input. The term "positional information," as used herein, refers to any information describing or otherwise indicating a position or location of the detected input (e.g., within the sensing region 120). Example positional information may include absolute position, relative position, velocity, acceleration, and/or other types of spatial information.

In some embodiments, the input device 100 may include a touch screen interface (e.g., display screen) that at least partially overlaps the sensing region 120. For example, the sensor electrodes of the input device 100 may form a substantially transparent overlay on the display screen, thereby providing a touch screen interface for the associated electronic system. The display screen may be any type of dynamic display capable of displaying a visual interface to a user. Examples of suitable display screen technologies may include light emitting diode (LED), organic LED (OLED), cathode ray tube (CRT), liquid crystal display (LCD), plasma, electroluminescence (EL), or other display technology.

In some embodiments, the input device 100 may share physical elements with the display screen. For example, one or more of the sensor electrodes may be used in displaying the interface and sensing inputs. More specifically, a sensor electrode used for sensing inputs may also operate as a display electrode used for displaying at least a portion of the interface. In some embodiments, the input device 100 may include a first sensor electrode configured for displaying at least part of the interface and sensing inputs, and a second sensor electrode may be configured for input sensing only. For example, the second sensor electrode may be disposed between substrates of the display device or may be external to the display device.

In some aspects, the display screen may be controlled or operated, at least in part, by the processing system 110. The processing system 110 may be configured to execute instructions related to sensing inputs and displaying the interface. For example, the processing system 110 may drive a display electrode to display at least a portion of the interface and sense user inputs, concurrently. In another example, the processing system 110 may drive a first display electrode to display at least a portion of the interface while concurrently driving a second display electrode to sense user inputs.

As described above, manufacturing defects may cause sensor electrodes in one or more of the sensing elements 121 to become shorted. Since capacitance is the measure of an ability to store charge between conductors, it may be difficult, if not impossible, to measure a capacitance (much less a change in capacitance) between shorted sensor electrodes. Thus, shorted electrodes may be inefficient and/or ineffective for use in many capacitive sensing applications. Aspects of the present disclosure may enable the input device 100 to detect and report electrical shorts between sensor electrodes of the sensing elements 121.

In some embodiments, the input device 100 may be configured to measure a resistance between pairs of sensor electrodes in the sensing region 120. For example, aspects of the present disclosure may leverage existing circuitry of the input device 100 to detect manufacturing defects in an array of sensor electrodes. In some aspects, the processing circuitry 110 may measure a capacitance across a pair of sensor electrodes in the sensing region 120 when operating in a first mode, and may measure a resistance between the pair of sensor electrodes when operating in a second mode. Thus, the processing circuitry 110 may be configured to operate as an ohmmeter and/or an input detector for the input device 100. In some aspects, the processing circuitry 110 may determine, based on the measured resistance, whether any of the sensor electrodes are shorted. In some other aspects, the processing circuitry 110 may use the measured resistance to detect other properties and/or inputs of the input device 100 (such as an amount of strain on the input device 100).

Figure 2:
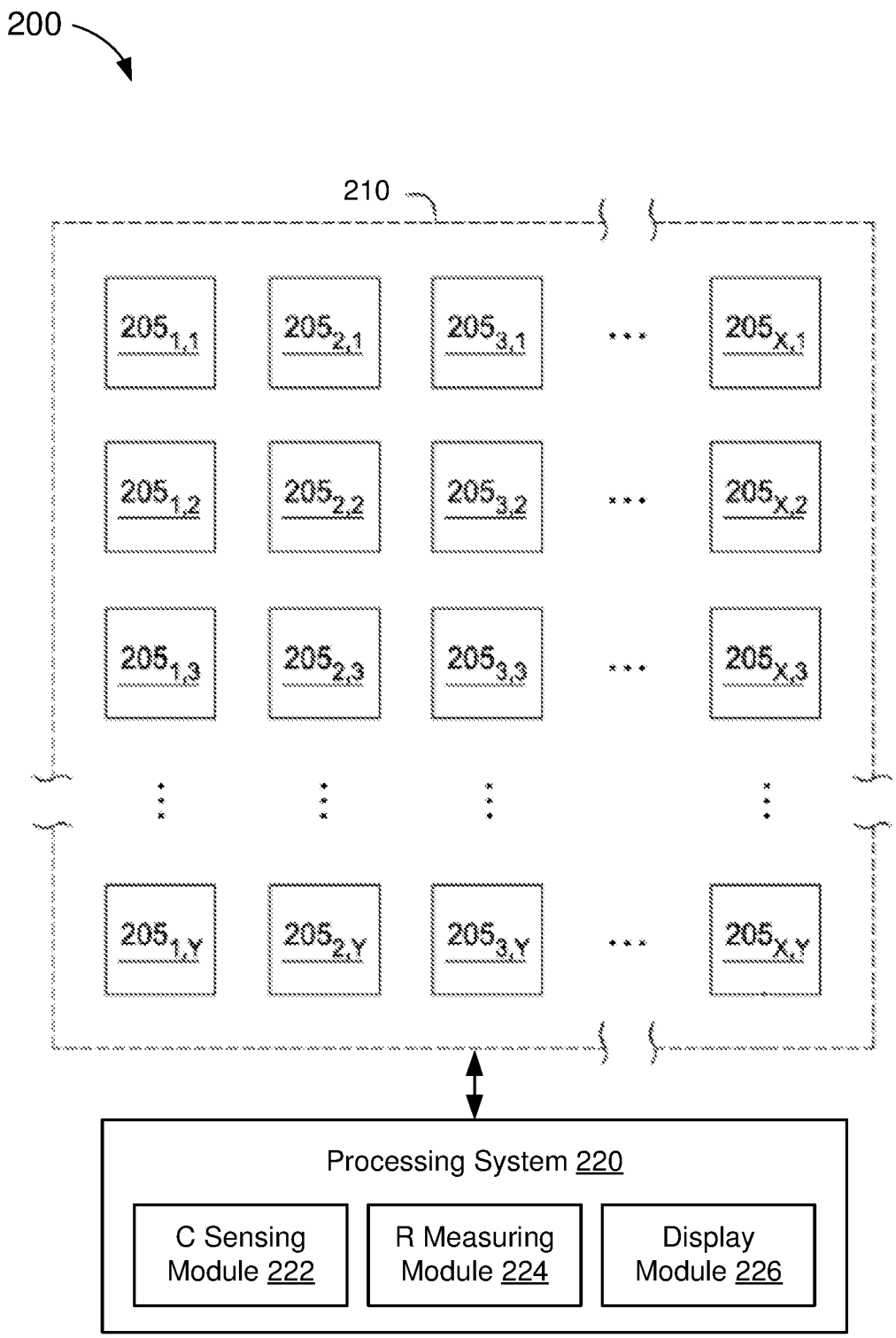
FIG. 2 shows a block diagram of an input device having ohmmeter circuitry, in accordance with some embodiments.

FIG. 2 shows a block diagram of an input device 200 having ohmmeter circuitry, in accordance with some embodiments. The input device 200 includes a sensing region 210 coupled to a processing system 220. The sensing region 210 may encompass any space above, around, in, and/or proximate to the input device 200 in which the input device 200 is able to detect user input, such as provided by one or more input objects (not shown for simplicity). The size, shape, and/or location of the sensing region 210 may vary depending on actual implementations.

The sensing region 210 includes an array of sensor electrodes $205_{X,Y}$ (referred to collectively as sensor electrodes 205) arranged in a number (X) of columns and a number (Y) of rows. The sensor electrodes 205 are coupled to the processing system 220 and used to detect inputs in the sensing region 210 based on capacitive couplings between pairs of sensor electrodes 205. In some embodiments, the sensor electrodes 205 may be configured to implement absolute capacitance sensing techniques. For example, the processing system 110 may drive each sensor electrode 205 with a modulated signal and measure a capacitance between the electrode 205 and the input object based on the modulated signal. In other embodiments, the sensor electrodes 205 may be configured to implement transcapacitive sensing techniques. For example, the processing system 110 may drive a first group of sensor electrodes 205 with a transmitter signal and receive resulting signals via a second group of sensor electrodes 205. In some other embodiments, one or more of the sensor electrodes 205 may comprise one or more display electrodes used for updating a display of the input device 200. For example, the display electrodes may comprise one or more segments of a Vcom electrode (common electrodes), a source line, gate line, anode electrode, cathode electrode, or any other element of the display.

A "capacitive pixel" may represent an area of localized capacitive coupling in the array of sensor electrodes 205. In some aspects, capacitive pixels may be formed between an individual sensor electrode 205 and an electrical ground (e.g., when operating in the absolute capacitance sensing mode). In some other aspects, capacitive pixels may be formed between pairs of sensor electrodes 205 (e.g., between a transmitter sensor electrode and a receiver sensor electrode, when operating in the transcapacitive sensing mode). The capacitive coupling may change with a proximity and/or motion of input objects in the sensing region 210, and may thus be used to determine the presence and/or position of an input object in the sensing region 210. A set of measurements from the capacitive pixels form a "capacitive image" (also referred to as a "capacitive frame") representative of the capacitive couplings across each of the sensor electrodes 205 in the sensing region 210.

In some embodiments, the sensor electrodes 205 may be electrically (or ohmically) isolated from one another. For example, one or more insulators may physically separate the sensor electrodes 205 and provide a relatively high (ideally, infinite) impedance between the sensor electrodes 205. However, due to manufacturing defects, the actual impedance may vary for individual pairs of sensor electrodes 205. In some instances, the resistance between two or more of the sensor electrodes 205 may be relatively small (e.g., <10 kΩ), causing such sensor electrodes 205 to effectively short to one another. Thus, it may be desirable to measure the impedance between the sensor electrodes 205 to detect any manufacturing defects and/or determine whether the sensor electrodes 205 are suitable for use in the input device 200.

In some embodiments, the processing system 220 may include a capacitive (C) sensing module 222, a resistance (R) measuring module 224, and a display module 226. The capacitive sensing module 222 may be configured to drive transmitter signals onto, and receive resulting signals from, one or more of the sensor electrodes 205. The transmitter signals may be modulated, and may be sent as one or more bursts over a period of time allocated for input sensing (e.g., sensing cycles). The capacitive sensing module 222 may alter the amplitude, frequency, and/or voltage of each transmitter signal to obtain more robust sensor information about an input object in contact with (or close proximity to) the sensing region 210. In some aspects, the capacitive sensing module 222 may be coupled to selected portions of the sensor electrodes 205, and configured to operate in either an absolute capacitance sensing mode or a transcapacitive sensing mode. In other aspects, the capacitive sensing module 222 may be coupled to different sensor electrodes 205 when operating in the absolute capacitance sensing mode than when operating in the transcapacitive sensing mode.

In some embodiments, the capacitive sensing module 222 may determine a position of an input object detected in the sensing region 210. In other embodiments, the capacitive sensing module 222 may output signals, including information indicative of the signals received via one or more of the sensor electrodes 205, to another module or processor. For example, the output signals may be provided to a determination module or processor of the electronic device (e.g., a host processor or timing controller with an integrator sensor processor), which may then determine the position of the input object in the sensing region 210. In some aspects, the capacitive sensing module 222 may include a plurality of receivers each operating as a respective analog front end (AFE) for the processing system 220.

The resistance measuring module 224 may be configured to measure an impedance between two or more of the sensor electrodes 205. In some embodiments, the resistance measuring module 224 may drive a voltage across a pair of sensor electrodes 205 and measure the resistance between the electrodes based on the resulting current. In some aspects, the resistance measuring module 224 may determine, based on the measured resistance, whether the corresponding pair of sensor electrodes 205 are shorted together. For example, an electrical short may be detected if the measured resistance is below a threshold level (e.g., <10 kΩ). In some other aspects, the resistance measuring 224 may use the measured resistance to detect other properties and/or inputs of the input device 200 (such as an amount of strain on the input device 200). Still further, in some aspects, the resistance measuring module 224 may leverage one or more components of the capacitive sensing module 222 (such as the AFE) to measure the resistance between the corresponding sensor electrodes 205. Thus, the AFE may be controlled by the capacitive sensing module 222 when measuring a capacitance across a pair of sensor electrodes in the sensing region 210, and may be controlled by the resistance measuring module 224 when measuring a resistance between the pair of sensor electrodes in the sensing region 210.

The display module 226 may be configured to drive display data onto one or more of the sensor electrodes 205 (e.g., when operating as display electrodes). In some embodiments, capacitive sensing (or impedance detection) and display updating may occur during at least partially overlapping periods. For example, as a combination electrode is driven for display updating, the combination electrode may also be driven for capacitive sensing. Alternatively, and/or in addition, the resistance measuring module 224 may measure the resistance between two or more combination electrodes while the combination electrodes are driven for display updating. In other embodiments, capacitive sensing (or impedance detection) and display updating may occur during non-overlapping periods (e.g., also referred to as "non-display update" periods). For example, the non-display update periods may occur between display line update periods for two display lines of a display frame. In some aspects, the capacitive sensing module 222 may be configured to drive one or more of the sensor electrodes 205 for capacitive sensing during one or more non-display update periods. In other aspects, the resistance measuring module 224 may be configured to measure the resistance between two or more of the sensor electrodes 205 during one or more non-display update periods.

Figure 3:
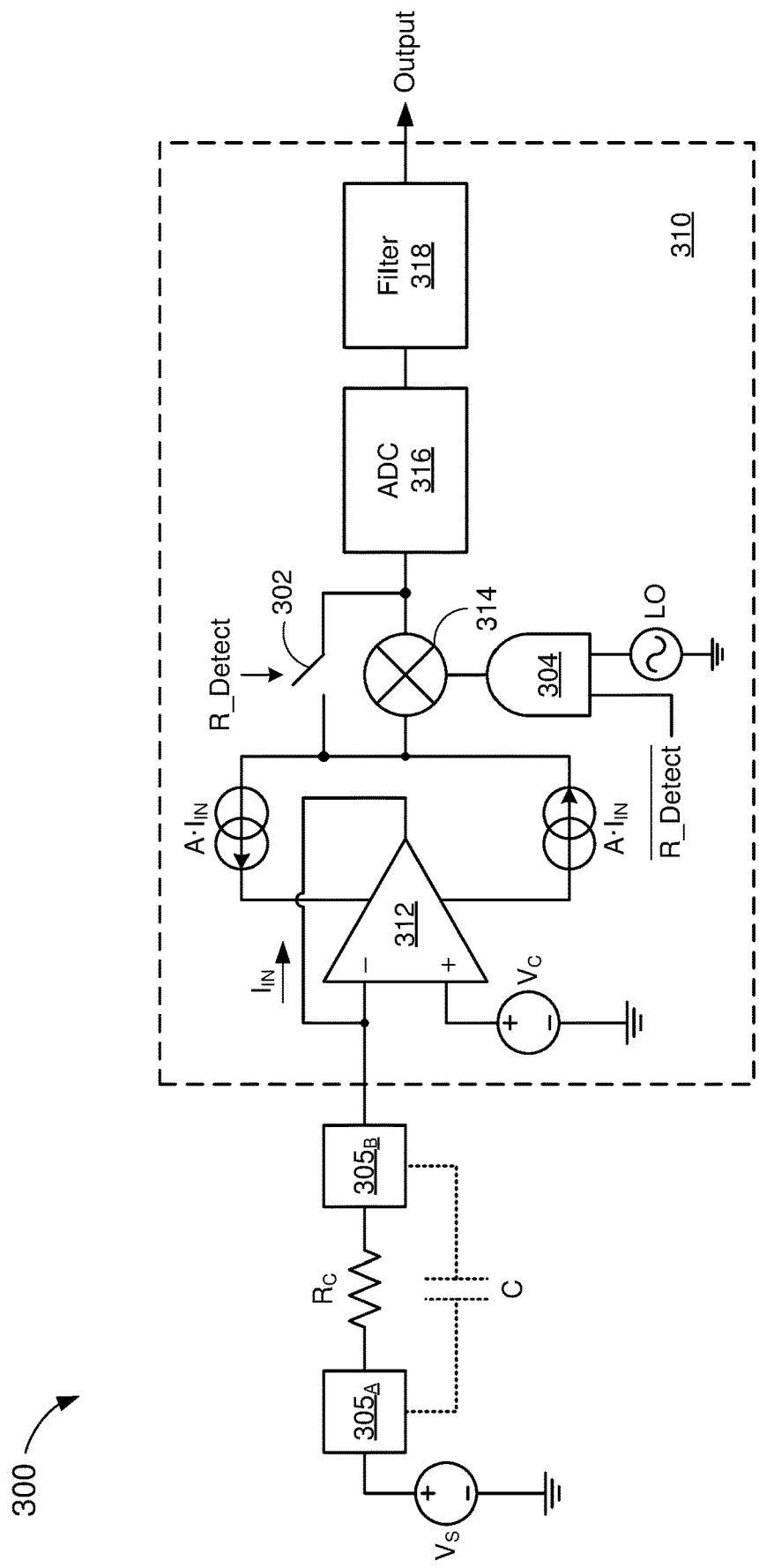
FIG. 3 shows a circuit diagram depicting an analog front end (AFE) for at least a portion of an input device, in accordance with some embodiments.

FIG. 3 shows a circuit diagram depicting an analog front end (AFE) 310 for at least a portion of an input device 300, in accordance with some embodiments. The AFE 310 is coupled to a pair of sensor electrodes $305_A$ and $305_B$. For example, the sensor electrodes $305_A$ and $305_B$ may correspond to any pair of adjacent sensor electrodes 205 of the sensing region 210. In some embodiments, the AFE 310 is a multi-modal AFE that can be configured to operate in a capacitive sensing mode or a resistance measuring mode. For example, when operating in the capacitive sensing mode, the AFE 310 may be used to detect user inputs in a sensing region of the input device 300 based, at least in part, on a capacitive coupling (C) of the sensor electrodes $305_A$ and $305_B$. When operating in the resistance measuring mode, the AFE 310 may measure a resistance ($R_C$) between the sensor electrodes $305_A$ and $305_B$.

The AFE 310 includes a current conveyor 312, a mixer 314, an analog-to-digital converter (ADC) 316, and a filter 318. In some embodiments, the current conveyor 312 may be an operation amplifier (op amp) having an inverting input (−) terminal coupled to the sensor electrode $305_B$ and a non-inverting input (+) terminal coupled to a voltage source $V_C$. The output terminal of the op amp is coupled to the inverting input terminal (e.g., in a negative feedback configuration). Thus, the "output" of the current conveyor 312 may be an amplified (or attenuated) signal (A·$I_{IN}$) provided across the voltage supply terminals of the op amp. The ADC 316 may be configured to receive an analog output signal from the current conveyor 312 and convert the analog output signal to a digital bit stream. In some embodiments, the ADC 316 may be a delta-sigma (ΔΣ) modulator that generates a single-bit stream at a sampling frequency of its internal clock (e.g., 20 MHz). The filter 318 may be configured to filter or convert the bit width, of the digital bit stream, to an expected length. In some embodiments, the filter 318 may be a decimation filter that filters out shaped quantization noise from the ΔΣ modulator to produce a higher-resolution bit stream at the output of the AFE 310.

In some embodiments, the mixer 314 may function as a demodulator to selectively demodulate the output signal (A·$I_{IN}$) from the current conveyer 312. For example, in some aspects, the mixer 314 may be switchably coupled between the current conveyor 312 and the ADC 316 via a switch 302. When the switch 302 is open, the mixer 314 may be coupled to receive the output signal from the current conveyor 312, and may be configured to down-convert or demodulate the received signal to a lower frequency by mixing the received signal with a lower-frequency reference signal. In some aspects, the lower-frequency reference signal may be provided by a local oscillator (LO). When the switch 302 is closed, the output signal from the current conveyor 312 bypasses the mixer 314 and flows directly into the ADC 316. In some embodiments, the switch 302 may be controlled (e.g., closed or opened) by a resistance detection (R_Detect) signal which may be asserted or deasserted based on an operating mode of the AFE 310. In some aspects, the output of the local oscillator (e.g., provided to the mixer 314) may also be gated by the R_Detect signal via an AND logic gate 304.

In some embodiments, one or more processors (e.g., processing system 220 of FIG. 2) coupled to the AFE 310 may assert the R_Detect signal when operating the AFE 310 in a resistance measuring mode, and may deassert the R_Detect signal when operating the AFE 310 in a capacitive sensing mode. Thus, the mixer 314 may be selectively coupled to the current conveyor 312 (or bypassed) based, at least in part, on the operating mode of the AFE 310. More specifically, the mixer 314 may be coupled to the current conveyor 312 when the AFE 310 is configured to operate in the capacitive sensing mode (e.g., R_Detect=0), and may be bypassed when the AFE 310 is configured to operate in the resistance measuring mode (e.g., R_Detect=1). Similarly, the logic gate 304 may provide the local oscillator signal to the mixer 314 when the AFE is configured to operate in the capacitive sensing mode, and may block the local oscillator signal from the mixer 314 when the AFE is configured to operate in the resistance measuring mode.

The AFE 310 may be configured to generate capacitive sensing information and/or resistance measurement information by sampling an input current ($I_{IN}$) received via the sensor electrodes 305$_A$ and 305$_B$. More specifically, the input current $I_{IN}$ may be generated based on a voltage bias applied across the sensor electrodes 305$_A$ and 305$_B$. For example, the voltage at the first sensor electrode 305$_A$ may be provided by a voltage supply ($V_S$) and the voltage at the second sensor electrode 305$_B$ may be provided by the inverting terminal of the current conveyor 312. Since the voltage at the non-inverting terminal of the current conveyor 312 is provided by the voltage source $V_C$, the voltage at the inverting terminal of the current conveyor 312 will also be equal to $V_C$ (e.g., as the op amp tries to equalize the voltages at its input terminals). Thus, the voltage differential ($V_{AB}$) between the sensor electrodes 305$_A$ and 305$_B$ may correspond to the difference in voltage between the voltage supply $V_S$ and the voltage source $V_C$ (e.g., $V_{AB}=V_S-V_C$).

It is noted that the biasing of the voltages $V_S$ and $V_C$ may directly affect the voltage that is "transmitted" to the sensor electrodes 305$_A$ and 305$_B$ (e.g., the results of which are received by the AFE 310 as an input current $I_{IN}$). Thus, in some embodiments, at least one of the voltages $V_S$ and/or $V_C$ may be "programmable" (e.g., controlled or adjusted by a controller or processor of the AFE 310). For example, the voltage supply $V_S$ may provide a fixed supply voltage whereas the voltage source $V_C$ may provide a variable control voltage that may be controlled or adjusted by a controller or processor of the AFE 310. In some aspects, one of the voltages $V_S$ or $V_C$ may be a ground potential. In other aspects, each of the voltages $V_S$ and $V_C$ may be controlled or adjusted by a controller or processor of the AFE 310. Because the current conveyor 312 has a limited dynamic range, the voltages $V_C$ and/or $V_S$ may be selected to ensure that the input current $I_{IN}$ does not exceed the dynamic range of the current conveyor 312.

When operating in the capacitive sensing mode, a time-varying voltage (such as provided by an alternating current (AC) voltage source) may be applied to the sensor electrodes 305$_A$ and 305$_B$. For example, the time-varying voltage may be generated by varying the amplitude of the control voltage $V_C$ relative to the source voltage $V_S$. The time-varying voltage produces a corresponding time-varying input current $I_{IN}$ having a frequency corresponding to a rate of the voltage change. The input current $I_{IN}$ is amplified (or attenuated) by the current conveyor 312 based on a gain (A) of the current conveyor 312. Since the AFE 310 is operating in the capacitive sensing mode, the R_Detect signal is deasserted (e.g., R_Detect=0), and thus the switch 302 is open and the local oscillator signal may be provided to the mixer 314 by the logic gate 304.

The mixer 314 receives the amplified input current A·$I_{IN}$ and demodulates the received input current A·$I_{IN}$ using the local oscillator signal. The ADC 316 converts the demodulated signal into a digital stream of bits (e.g., discrete samples of the AC input current A·$I_{IN}$), and the filter 318 filters the bits to improve the resolution of the digital bit stream at the output of the AFE 310. Accordingly, the quantized representation of the input current $I_{IN}$ (e.g., at the output of the AFE 310) may be used to derive the capacitance C of the sensor electrodes 305$_A$ and 305$_B$ $$\text{(e.g., } i_{IN}(t) = C\frac{dv_{AB}(t)}{dt},$$

wherein $i_{IN}$ is an AC value).

When operating in the resistance measuring mode, a constant voltage (such as provided by a direct current (DC) voltage source) may be applied to the sensor electrodes 305$_A$ and 305$_B$. For example, the constant voltage may be generated by maintaining the control voltage $V_C$ at a constant amplitude relative to the source voltage $V_S$. The constant voltage produces a constant input current $I_{IN}$, which is amplified (or attenuated) by the current conveyor 312 based on the gain A of the current conveyor 312. Since the AFE 310 is operating in the resistance measuring mode, the R_Detect signal is asserted (e.g., R_Detect=1), and thus the switch 302 is closed and the local oscillator signal may be suppressed by the logic gate 304.

The closing of the switch 302 causes the amplified input current A·$I_{IN}$ to bypass the mixer 314 (e.g., which may be desirable since the current $I_{IN}$ has a constant amplitude), and be provided directly to the ADC 316. The ADC 316 converts the amplified input current into a digital stream of bits (e.g., discrete samples of the DC input current $A \cdot I_{IN}$), and the filter 318 filters the bits to improve the resolution of the digital bit stream at the output of the AFE 310. Accordingly, the quantized representation of the input current $I_{IN}$ (e.g., at the output of the AFE 310) may be used to derive the resistance $R_C$ between the sensor electrodes $305_A$ and $305_B$ $$\text{(e.g., } i_{IN} = \frac{V_{AB}}{R_C},$$

wherein $I_{IN}$ is a DC value).

In some embodiments, the output of the AFE 310 may be provided to one or more processors of the input device 300 (such as the processing system 110 of FIG. 1 or processing system 220 of FIG. 2) for further processing. For example, when operating in the capacitive sensing mode, the processing system may detect a presence and/or position of an input object in the sensing region based on the capacitance C of the sensor electrodes $305_A$ and $305_B$. On the other hand, when operating in the resistance measuring mode, the processing system may determine whether the sensor electrodes $305_A$ and $305_B$ are effectively shorted to one another (e.g., and thus unsuitable for capacitive sensing implementations) based on the resistance $R_C$ between the sensor electrodes $305_A$ and $305_B$.

In some implementations, information about the measured resistance $R_C$ (and/or detected electrical shorts) may be provided to the manufacturer of the sensor array (e.g., for quality control purposes). In other implementations, the input device 300 may use the information about the measured resistance $R_C$ (and/or detected electrical shorts) to dynamically adjust one or more components of its sensing circuitry. For example, the input device 300 may adjust the voltage $V_C$ and/or $V_S$ based on the measured resistance $R_C$, so that the input current $I_{IN}$ does not exceed the dynamic range of the current conveyor 312. If the input device 300 determines that the sensor electrodes $305_A$ and $305_B$ are shorted to one another (e.g., $R_C$<10 kΩ), the input device 300 may avoid using the sensor electrodes $305_A$ and $305_B$ for capacitive sensing operations (e.g., by disabling the AFE 310).

It is noted that there may be voltage and/or current offsets in the AFE 310 that affect the accuracy of the measured resistance $R_C$. Thus, in some aspects, the AFE 310 may be decoupled from the sensor electrodes $305_A$ and $305_B$ (e.g., via a switch or multiplexer, not shown for simplicity) to acquire a "baseline" resistance measurement. This baseline resistance may then be subtracted from all subsequent measurements of $R_C$ (e.g., when the AFE 310 is coupled to the sensor electrodes $305_A$ and $305_B$) to determine a more accurate measurement of the actual resistance between the sensor electrodes $305_A$ and $305_B$. In some implementations, the measured resistance $R_C$ also may include a measure of the parasitic on-chip resistance of the input device 300. Thus, in some aspects, the input device 300 may filter out this parasitic resistance from the measured resistance $R_C$.

It is also noted that the range of resistances $R_C$ detectable by the AFE 310 may be limited by the configuration of the current conveyor 312 (such as the gain A of the op amp) and/or the ADC 316 (such as a reference current used to sample the amplified input current $A \cdot I_{IN}$). Thus, in some embodiments, the input device 300 may increase the range of resistances $R_C$ that are detectable by the AFE 310 by adjusting the gain A of the current conveyor 312 and/or the reference current of the ADC 316.

Aspects of the present disclosure may be used to measure the resistance between any conductive elements of an input device, and are not limited to capacitive sensor electrodes. For example, in some embodiments, the sensor electrodes $305_A$ and $305_B$ may be used to measure strain or other forces exerted on the input device 300 (e.g., strain gauge, piezoresistive sensor, piezoelectric sensor, and the like). More specifically, the resistance of the sensor electrodes $305_A$ and $305_B$ may correlate with an amount of strain on the input device 300 at any given time. In some aspects, excessive strain on the input device 300 may be undesirable (e.g., as it may degrade the performance and/or reliability of the input device 300). In some other aspects, the strain on the input device 300 may correspond with a user input (e.g., indicating an amount of force or pressure applied by an object in contact with the sensing region of the input device 300). Thus, in some embodiments, the resistance measured by the AFE 310 may be used to detect other properties and/or inputs of the input device 300.

Figure 4:
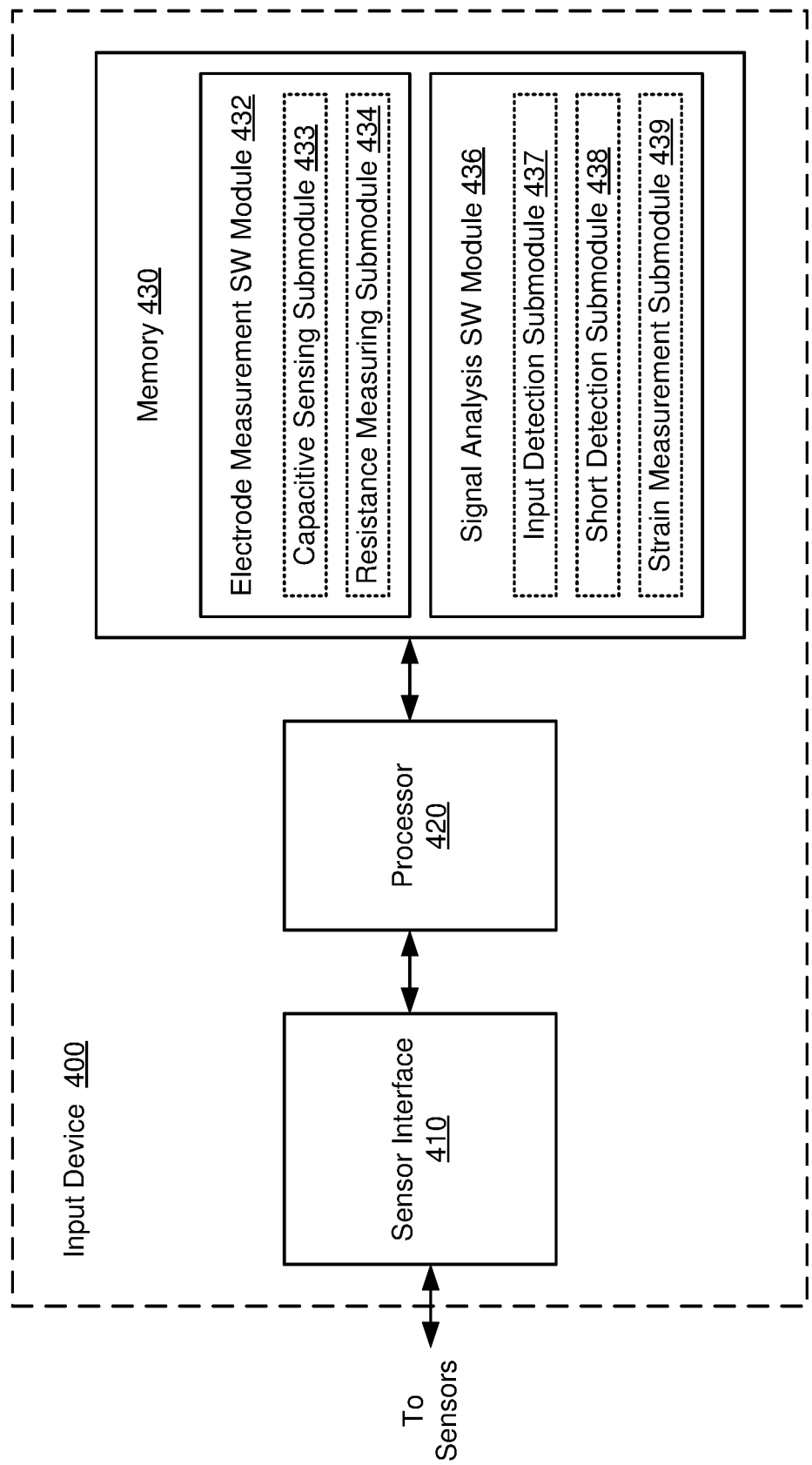
FIG. 4 shows a block diagram of an input device with capacitive sensing and resistance measuring capabilities, in accordance with some embodiments.

FIG. 4 shows a block diagram of an input device 400 with capacitive sensing and resistance measuring capabilities, in accordance with some embodiments. The input device 400 may be an example embodiment of any of the input devices 100, 200, or 300 of FIGS. 1-3. In some embodiments, the input device 400 may include a sensor interface 410, a processor 420, and a memory 430.

The sensor interface 410 may be coupled to a plurality of sensor electrodes (such as sensing elements 121 of FIG. 1, sensor electrodes 205 of FIG. 2, or sensor electrodes 305 of FIG. 3). More specifically, the sensor interface 410 may be used to communicate with the sensor electrodes when operating in a capacitive sensing mode or a resistance measuring mode. For example, the sensor interface 410 may transmit signals to a first sensor electrode (e.g., of a pair of sensor electrodes) and receive resulting signals from a second sensor electrode (e.g., of the pair of sensor electrodes). When operating in the capacitive sensing mode, the first sensor electrode may be a transmitter electrode and the second sensor electrode may be a receiver electrode.

The memory 430 may include a non-transitory computer-readable medium (e.g., one or more nonvolatile memory elements, such as EPROM, EEPROM, Flash memory, a hard drive, etc.) that may store at least the following software (SW) modules:

an electrode measurement SW module 432 to produce an input current across a pair of sensor electrodes based at least in part on an operating mode of the input device 400, the electrode control SW module 432 including:

a capacitive sensing submodule 433 to measure a capacitance across the pair of sensor electrodes based on the input current when operating in the capacitive sensing mode; and a resistance measuring submodule 434 to measure a resistance between the pair of sensor electrodes based on the input current when operating in the resistance measuring mode; and a signal analysis SW module 436 to determine information associated with the input current based at least in part on the operating mode of the input device 400, the signal analysis SW module 436 including:

an input detection submodule 437 to detect user inputs in a sensing region of the input device 400 based at least in part on the measured capacitance (e.g., when operating in the capacitive sensing mode);

a short detection submodule 438 to detect electrical shorts between the pair of sensor electrodes based at least in part on the measured resistance (e.g., when operating in the resistance measuring mode); and a strain measurement submodule 439 to determine an amount of strain on the input device based at least in part on the measured resistance (e.g., when operating in the resistance measuring mode).

Each software module includes instructions that, when executed by the processor 420, cause the input device 400 to perform the corresponding functions. The non-transitory computer-readable medium of memory 430 thus includes instructions for performing all or a portion of the operations described below with respect to FIG. 5.

Processor 420 may be any suitable one or more processors capable executing scripts or instructions of one or more software programs stored in the input device 400 (e.g., within memory 430). For example, the processor 420 may execute the electrode measurement SW module 432 to produce an input current across a pair of sensor electrodes based at least in part on an operating mode of the input device 400. In executing the electrode measurement SW module 432, the processor 420 may further execute the capacitive sensing submodule 433 or the resistance measuring submodule 434. For example, the processor 420 may execute the capacitive sensing submodule 433 to measure a capacitance across the pair of sensor electrodes based on the input current when operating in the capacitive sensing mode. Further, the processor 420 may execute the resistance measuring submodule 434 to measure a resistance between the pair of sensor electrodes based on the input current when operating in the resistance measuring mode.

The processor 420 may also execute the signal analysis SW module 436 to determine information associated with the input current based at least in part on the operating mode of the input device 400. In executing the signal analysis SW module 436, the processor 420 may further execute the input detection submodule 437, the short detection submodule 438, or the strain measurement submodule 439. For example, the processor 420 may execute the input detection submodule 437 to detect user inputs in a sensing region of the input device 400 based at least in part on the measured capacitance (e.g., when operating in the capacitive sensing mode). The processor 420 may further execute the short detection submodule 438 to detect electrical shorts between the pair of sensor electrodes based at least in part on the measured resistance (e.g., when operating in the resistance measuring mode). Still further, the processor 420 may execute the strain measurement submodule 439 to determine an amount of strain on the input device based at least in part on the measured resistance (e.g., when operating in the resistance measuring mode).

Figure 5:
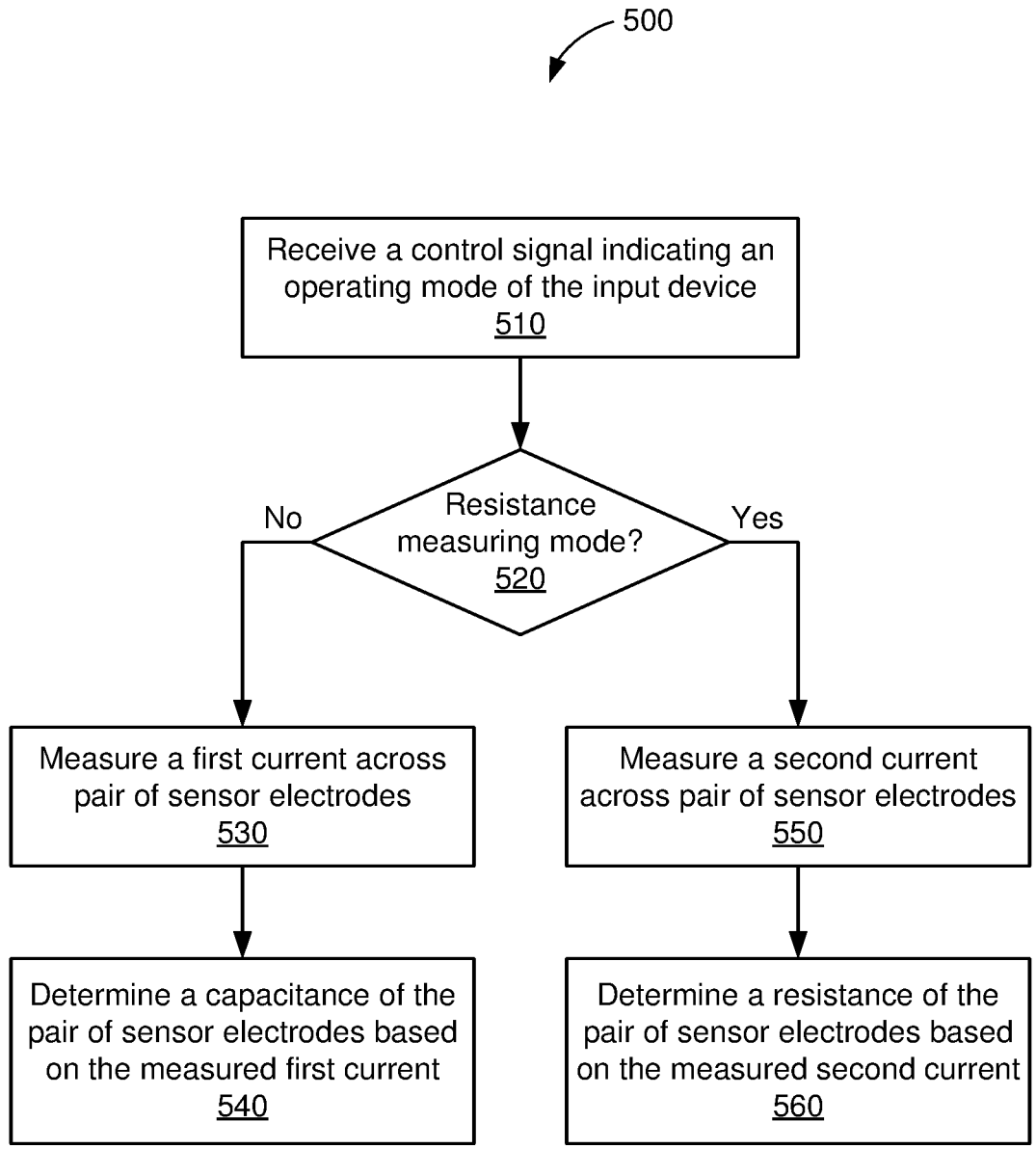
FIG. 5 shows an illustrative flowchart depicting an example operation for operating an input device with capacitive sensing and resistance measuring capabilities, in accordance with some embodiments.

FIG. 5 shows an illustrative flowchart depicting an example operation 500 for operating an input device with capacitive sensing and resistance measuring capabilities, in accordance with some embodiments. With reference for example to FIG. 2, the operation 500 may be performed by the processing system 220 to selectively measure a capacitance and/or resistance across two or more sensor electrodes.

The processing system 220 may receive a control signal indicating an operating mode of a corresponding input device (510). In some embodiments, the input device may be configurable in a capacitive sensing mode or a resistance measuring mode. Thus, the control signal may indicate a selection of either the capacitive sensing mode or the resistance measuring mode. In some aspects, the operating mode of the input device may be user selectable. In some other aspects, the operating mode of the input device may be selected by one or more processors and/or applications executing on (or external to) the input device.

The processing system may determine, based on the received control signal, whether the input device is configured to operate in the resistance measuring mode (520). For example, in some aspects, the control signal may correspond to R_Detect signal of FIG. 3. Thus, when deasserted, the control signal may indicate that the input device is to operate in the capacitive sensing mode. On the other hand, when asserted, the control signal may indicate that the input device is to operate in the resistance measuring mode.

When the control signal indicates that the input device is not configured to operate in the resistance measuring mode (as tested at 520), the processing system 220 may measure a first current across a pair of sensor electrodes of the input device (530). In some embodiments, when the processing system 220 (or input device 200) operates in the capacitive sensing mode, the capacitive sensing module 222 may drive a time-varying voltage across the pair of sensor electrodes to produce an alternating current (AC). With reference for example to the AFE 310 of FIG. 3, the time-varying voltage may be generated by varying the amplitude of the control voltage $V_C$ relative to the source voltage $V_S$.

The processing system 220 may then determine a capacitance of the pair of sensor electrodes based on the measured first current (540). With reference for example to the AFE 310, when operating in the capacitive sensing mode, the input signal is amplified (or attenuated) by the current conveyor 312 and subsequently demodulated by the mixer 314. The ADC 316 converts the demodulated signal into a digital stream of bits and the filter 318 filters the bits to improve the resolution of the digital bit stream at the output of the AFE 310. The capacitive sensing module 222 may then determine the capacitance (C) of the pair of sensor electrodes based on the quantized representation of the input signal $$\left(\text{e.g., } i_{IN}(t) = C\frac{dv_{AB}(t)}{dt}\right).$$

In some aspects, the capacitive sensing module 222 may further detect user inputs in a sensing region of the input device 200 based at least in part on the measured capacitance.

When the control signal indicates that the input device is configured to operate in the resistance measuring mode (as tested at 520), the processing system 220 may measure a second current across the pair of sensor electrodes (550). In some embodiments, when the processing system 220 (or input device 200) operates in the resistance measuring mode, the resistance measuring module 224 may drive a constant voltage across the pair of sensor electrodes to produce a direct current (DC). With reference for example to the AFE 310, the constant voltage may be generated by maintaining the control voltage $V_C$ at a constant amplitude relative to the source voltage $V_S$.

The processing system 220 may then determine a resistance of the pair of sensor electrodes based on the measured second current (560). With reference for example to the AFE 310, when operating in the resistance measuring mode, the input signal is amplified (or attenuated) by the current conveyor 312 and subsequently provided directly to the ADC 316 (e.g., bypassing the mixer 314). The ADC 316 converts the amplified input current into a digital stream of bits and the filter 318 filters the bits to improve the resolution of the digital bit stream at the output of the AFE 310. The resistance measuring module 224 may then determine the resistance ($R_C$) between the pair of sensor electrodes based on the quantized representation of the input signal $$\left(\text{e.g., } I_{IN} = \frac{V_{AB}}{R_C}\right).$$

In some aspects, the resistance measuring module 224 may further detect electrical shorts between the pair of sensor electrodes based at least in part on the measured resistance. In some other aspects, the resistance measuring module 224 may also detect other properties and/or inputs of the input device 200 (such as an amount of strain on the input device 200) based on the measured resistance.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An input device, comprising:
   a plurality of sensor electrodes disposed within a sensing region of the input device; and
   a processing system coupled to at least a pair of the sensor electrodes and configured to operate in at least a first mode or a second mode, the processing system including:
   an analog-to-digital converter (ADC) configured to convert an input current from the pair of sensor electrodes to a digital bit stream, wherein the bit stream is a quantized representation of the input current; and
   a mixer switchably coupled to the ADC based at least in part on an operating mode of the processing system, wherein:
   when operating in the first mode, the processing system is configured to:
   measure a first current across the pair of sensor electrodes; and
   determine a capacitance of the pair of sensor electrodes based on
   the measured first current; and
   when operating in the second mode, the processing system is configured to:
   measure a second current across the pair of sensor electrodes; and
   determine a resistance between the pair of sensor electrodes based on the measured second current.

2. The input device of claim 1, wherein, when operating in the first mode, the processing system is further configured to:
   detect user inputs in the sensing region based at least in part on the determined capacitance.

3. The input device of claim 1, wherein, when operating in the second mode, the processing system is further configured to:
   detect electrical shorts between the pair of sensor electrodes based at least in part on the determined resistance.

4. The input device of claim 1, wherein, when operating in the second mode, the processing system is further configured to:
   determine an amount of strain on the input device based at least in part on the determined resistance.

5. The input device of claim 1, wherein the processing system is further configured to:
   drive a time-varying voltage across the pair of sensor electrodes to produce the first current; and
   drive a constant voltage across the pair of sensor electrodes to produce the second current.

6. The input device of claim 1, wherein the processing system further comprises:
   an amplifier configured to receive and amplify the input current from the pair of sensor electrodes and provide the amplified current to the ADC.

7. The input device of claim 1, wherein the mixer is configured to demodulate the input current when the processing system operates in the first mode.

8. The input device of claim 1, wherein the input current is provided directly to the ADC, bypassing the mixer, when the processing system operates in the second mode.

9. A method of operating an input device, comprising:
   receiving a control signal indicating an operating mode of the input device, wherein the input device is configurable in at least a first mode or a second mode;
   converting an input current from a pair of sensor electrodes to a digital bit stream, wherein the bit stream is a quantized representation of the input current;

selectively demodulating the input current prior to converting the input current to the digital bit stream based at least in part on the control signal;

determining a capacitance of the pair of sensor electrodes disposed within a sensing region of the input device when the control signal indicates the first mode of operation, wherein the capacitance is determined by:
measuring a first current across the pair of sensor electrodes; and
determining the capacitance of the pair of sensor electrodes based on the measured first current; and determining a resistance of the pair of sensor electrodes when the control signal indicates the second mode of operation, wherein the resistance is determined by:
measuring a second current across the pair of sensor electrodes; and
determining the resistance between the pair of sensor electrodes based on the measured second current.

10. The method of claim 9, further comprising:
detecting user inputs in the sensing region based at least in part on the determined capacitance when the control signal indicates the first mode of operation.

11. The method of claim 9, further comprising:
detecting electrical shorts between the pair of sensor electrodes based at least in part on the determined resistance when the control signal indicates the second mode of operation.

12. The method of claim 9, further comprising:
determining an amount of strain on the input device based at least in part on the determined resistance when the control signal indicates the second mode of operation.

13. The method of claim 9, further comprising:
driving a time-varying voltage across the pair of sensor electrodes to produce the first current; and
driving a constant voltage across the pair of sensor electrodes to produce the second current.

14. The method of claim 9, further comprising:
amplifying the input current from the pair of sensor electrodes prior to selectively demodulating the input current.

15. The method of claim 9, wherein the selectively demodulating comprises:
demodulating the input current when the control signal indicates the first mode of operation.

16. The method of claim 9, wherein the selectively demodulating comprises:
converting the input current directly to the digital bit stream, without demodulating the input current, when the control signal indicates the second mode of operation.

17. An analog front end (AFE) for an input device operable in at least a first mode or a second mode, the AFE comprising:
an amplifier configured to amplify an input current received from a pair of sensor electrodes;
a demodulator configured to selectively demodulate the amplified input current based at least in part on the operating mode of the input device; and
an analog-to-digital converter (ADC) configured to convert the amplified input current to:
an alternating current (AC) value indicating a capacitance of the pair of sensor electrodes when the input device is configured to operate in the first mode; and
a direct current (DC) value indicating a resistance between the pair of sensor electrodes when the input device is configured to operate in the second mode,
wherein the demodulator includes a mixer switchably coupled between the amplifier and the ADC based at least in part on the operating mode of the input device.

18. The AFE of claim 17, wherein the mixer is configured to demodulate the amplified input current when the input device is configured to operate in the first mode.

19. The AFE of claim 17, wherein the amplified input current is provided directly to the ADC, bypassing the mixer, when the input device is configured to operate in the second mode.

* * * * *